US008460980B2

(12) United States Patent
Kronholz et al.

(10) Patent No.: US 8,460,980 B2
(45) Date of Patent: Jun. 11, 2013

(54) TRANSISTOR COMPRISING AN EMBEDDED SEMICONDUCTOR ALLOY IN DRAIN AND SOURCE REGIONS EXTENDING UNDER THE GATE ELECTRODE

(75) Inventors: Stephan Kronholz, Dresden (DE); Maciej Wiatr, Dresden (DE); Matthias Kessler, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 165 days.

(21) Appl. No.: 12/709,966

(22) Filed: Feb. 22, 2010

(65) Prior Publication Data
US 2010/0219474 A1 Sep. 2, 2010

(30) Foreign Application Priority Data
Feb. 27, 2009 (DE) .......................... 10 2009 010 882

(51) Int. Cl.
*H01L 27/12* (2006.01)
*H01L 27/762* (2006.01)

(52) U.S. Cl.
USPC ............ 438/151; 257/E21.561; 257/E27.112; 257/347; 438/300

(58) Field of Classification Search
USPC .......... 257/347, 247, 335, E21.561, E27.112, 257/369; 438/151, 300, 296, 289, 478, 269, 438/257, 268, 285, 752
See application file for complete search history.

(56) References Cited

U.S. PATENT DOCUMENTS

| 5,143,862 | A  | * | 9/1992  | Moslehi .................. 438/413 |
| 6,946,350 | B2 | * | 9/2005  | Lindert et al. ............. 438/285 |
| 7,045,407 | B2 | * | 5/2006  | Keating et al. ............. 438/198 |
| 7,153,753 | B2 | * | 12/2006 | Forbes ..................... 438/404 |
| 7,238,561 | B2 | * | 7/2007  | Zhang et al. .............. 438/197 |
| 7,670,934 | B1 | * | 3/2010  | Pal et al. .................. 438/481 |
| 2007/0072380 | A1 | * | 3/2007 | Wirbeleit et al. .......... 438/303 |
| 2007/0196989 | A1 | * | 8/2007 | Kim et al. ................. 438/300 |
| 2007/0228482 | A1 | * | 10/2007 | Wei et al. ................. 257/369 |
| 2008/0048217 | A1 | * | 2/2008 | Kim et al. ................. 257/288 |
| 2008/0237634 | A1 | * | 10/2008 | Dyer et al. ................ 257/190 |
| 2009/0032841 | A1 |   | 2/2009 | Eller et al. ................ 257/190 |

OTHER PUBLICATIONS

Translation of Official Communication from German Patent Office for German Patent Application No. 10 2009 010 882.3 dated Mar. 17, 2010.

* cited by examiner

*Primary Examiner* — Robert Huber
*Assistant Examiner* — Sheng Zhu
(74) *Attorney, Agent, or Firm* — Willams, Morgan & Amerson, P.C.

(57) ABSTRACT

A strain-inducing semiconductor alloy may be formed on the basis of cavities that may extend deeply below the gate electrode structure, which may be accomplished by using a sequence of two etch processes. In a first etch process, the cavity may be formed on the basis of a well-defined lateral offset to ensure integrity of the gate electrode structure and, in a subsequent etch process, the cavity may be increased in a lateral direction while nevertheless reliably preserving a portion of the channel region. Consequently, the strain-inducing efficiency may be increased by appropriately positioning the strain-inducing material immediately below the channel region without compromising integrity of the gate electrode structure.

15 Claims, 8 Drawing Sheets

TRANSISTOR COMPRISING AN EMBEDDED SEMICONDUCTOR ALLOY IN DRAIN AND SOURCE REGIONS EXTENDING UNDER THE GATE ELECTRODE

BACKGROUND OF THE INVENTION

1. Field of the Invention

Generally, the present disclosure relates to the fabrication of integrated circuits, and, more particularly, to transistors having strained channel regions by using embedded semiconductor alloys, such as silicon/germanium, to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates, to design highly complex circuit assemblies, such as CPUs, storage chips and the like. During the fabrication of complex integrated circuits using CMOS technology, transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may also be adapted to the reduced channel length in order to maintain the required channel controllability. However, some mechanisms for maintaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard requiring extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium material next to the channel region to induce a compressive stress that may result in a corresponding strain. When forming the silicon/germanium material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although this technique provides significant advantages in view of performance gain of P-channel transistors and thus of the entire CMOS device, it turns out, however, that a further increase of the strain component in the channel region may be difficult to achieve by reducing the lateral offset of the silicon/germanium alloy with respect to the channel region without compromising integrity of the gate electrode structure, as will now be described in more detail with reference to FIGS. 1a-1c to more clearly demonstrate one conventional approach for forming a silicon/germanium alloy.

FIG. 1a schematically illustrates a cross-sectional view of a conventional semiconductor device 100 at an early manufacturing stage. As illustrated, the semiconductor device 100 comprises a substrate 101, such as a silicon substrate, above which may be formed a buried insulating layer (not shown), if a silicon-on-insulator (SOI) configuration is considered. Furthermore, a silicon-based semiconductor layer 102 is formed above the substrate 101 and represents an "active" semiconductor material for forming therein and thereon circuit elements, such as transistors and the like. As illustrated, the semiconductor layer 102 comprises a first active region 102A and a second active region 102B which are separated by an isolation structure 103, such as a shallow trench isolation and the like. The active region 102A represents an appropriately doped semiconductor material for forming therein and thereabove a P-channel transistor 150A, while the active region 102B may have an appropriate dopant concentration so as to provide the basic characteristics for an N-channel transistor 150B. In the manufacturing stage shown, the transistors 150A, 150B comprise a gate electrode structure 151, which may include a gate electrode material 151A, a cap layer 151B formed on a top surface of the gate electrode material 151A and a gate insulation layer 151C, which separates the gate electrode material 151A from a channel region 152 of the corresponding active regions 102A, 102B. Furthermore, a spacer element 104A is formed on sidewalls of the gate electrode structure 151 of the P-channel transistor 150A, possibly in combination with an etch stop liner 105. On the other hand, the N-channel transistor 150B is covered by a spacer layer 104, possibly in combination with the etch stop liner 105.

The semiconductor device 100 may be formed according to the following process techniques in compliance with well-established conventional approaches for providing a silicon/germanium alloy. After defining the active regions 102A, 102B by forming the isolation structure 103 and performing appropriate implantation sequences in order to establish the basic dopant concentration, the gate electrode structures 151 may be formed by providing an appropriate material for the gate insulation layers 151C followed by the deposition of a gate electrode material 151A. Furthermore, material of the cap layers 151B may be deposited. For this purpose, well-established oxidation, surface treatments and deposition techniques may be used, depending on the required materials and characteristics thereof. For example, the material for the gate insulation layer 151C may be formed by oxidation and/or deposition or surface treatment, for instance for forming silicon dioxide-based materials having a thickness of approximately one to several nanometers in sophisticated semiconductor devices. In other cases, high-k dielectric materials may be used, such as hafnium oxide and the like, which may typically have a dielectric constant of 10 or higher, thereby increasing the capacitive coupling of the gate electrode material 151A to the channel region 152 for a given physical thickness of the gate dielectric material. Thereafter, any appropriate material for the gate electrode 151A may be provided, for instance in the form of polysilicon and the like, followed by the deposition of the cap material 151B, which may be provided in the form of a silicon nitride material and the like. During the subsequent patterning of these material layers, sophisticated lithography techniques and etch processes may be used in order to obtain the gate electrode structure 151 with a desired gate length according to the design rules for the device 100. Next, the etch stop liner 105 may be formed by deposition and/or oxidation, followed by the deposition of the spacer layer 104, typically provided in the form of a silicon nitride material, which may be deposited by thermally activated chemical vapor deposition (CVD) recipes, plasma assisted processes and the like. When depositing the spacer layer 104, a thickness thereof may be selected in view of a desired width 104W of the spacer element 104A, which in turn may determine an offset of the silicon/germanium alloy to be formed in the active region 102A in a later manufacturing stage. In sophisticated applications, the width 104W is desirably reduced in order to enhance the strain-inducing mechanism obtained by the silicon/germanium material. However, although a reduced thickness of the spacer layer 104 may be desirable in view of a performance gain of the transistor 150A, a certain minimum value for the thickness of the spacer layer 104 may have to be provided in view of maintaining overall integrity of the gate electrode material 151A and of the gate insulation layer 151C during the further processing in providing the strained silicon/germanium alloy. Consequently, typically a thickness of 10-30 nm may be selected, thereby providing a required process margin in view of the subsequent manufacturing processes. After forming the spacer layer 104, an etch mask 106 is provided on the basis of photolithography techniques in order to cover the transistor 150B and the corresponding portion of the spacer layer 104, while exposing the transistor 150A to an etch ambient 107 that is designed to selectively remove material of the spacer layer 104, thereby forming the spacer element 104A. The etch process 107 may be performed on the basis of well-established plasma assisted anisotropic etch techniques, wherein, if required, a control of the etch process may be accomplished on the basis of the etch stop liner 105. Thereafter, the liner 105 may be removed and a further etch process or a further step of the process 107 may be performed on the basis of appropriately selected etch parameters and an anisotropic etch chemistry for etching into the active region 102A selectively to the spacer 104A and the isolation structure 103. For example, highly selective anisotropic etch techniques for removing silicon selectively to oxide and nitride are well established in the art.

FIG. 1b schematically illustrates the semiconductor device 100 in a further advanced manufacturing stage. As illustrated, corresponding cavities 108 are formed adjacent to the gate electrode structure 151 and the spacer element 104A, wherein, due to the anisotropic nature of the preceding plasma assisted etch process, substantially vertical sidewalls 108S are obtained so that a lateral offset of the cavities 108 and thus of any silicon/germanium alloy still to be formed in a later manufacturing stage with respect to the gate electrode material 151A is substantially determined by the width 104W of the spacer 104A, possibly in combination with the thickness of the etch stop liner 105, if provided. After the corresponding cavity etch process or prior to the process, the etch mask 106 may be removed.

As previously discussed, the efficiency of the strain-inducing mechanism obtained by the strain-inducing semiconductor alloy, such as the silicon/germanium alloy to be filled into the cavities 108, significantly depends on the internal strain level of the semiconductor alloy and on the amount and the lateral distance of the semiconductor alloy with respect to the channel region 152. Since the depth of the cavities 108 is substantially determined by the initial thickness of the semiconductor layer 102, in particular when an SOI configuration is considered, further enhancement of the strain-inducing mechanism may typically be accomplished by reducing the lateral offset for a given type of strain-inducing semiconductor alloy. Consequently, the width 104W of the spacer 104A is typically reduced, wherein, however, further process related constraints may have to be respected, which may set the limit for a minimum width 104W. For example, the spacer 104A may provide integrity of the gate insulation layer 151C and the gate electrode material 151A during the preceding anisotropic etch process and also during a subsequent process sequence for preparing the semiconductor device 100 for the selective epitaxial deposition of the silicon/germanium material. For example, in sophisticated applications, frequently, advanced gate electrode structures comprising a high-k dielectric material in the gate insulation layer 151C may be used in combination with a metal-containing electrode material, which may have to be reliably confined in order to maintain the characteristics thereof, for instance with respect to relative permittivity, work function and the like. In other cases, an extremely thin silicon dioxide-based material may be used, the exposure of which to any etch ambient may result in significant damage and thus unpredictable device characteristics of the transistor 150A. Furthermore, in a subsequent manufacturing stage, the device 100 may be heated to an elevated temperature of, for instance, 800° C. and higher in order to prepare the device 100 for being loaded into a chamber or process ambient that is appropriate for performing a selective epitaxial growth process. For example, a native oxide which may have formed on exposed surface areas in the cavities 108 may be removed, wherein, however, a certain degree of silicon reflow may occur and may thus result in a certain deformation of the shape of the cavities 108. Consequently, a further reduction of the width 104W may be associated with a high probability of inducing damage in the gate electrode structure 151, which may not be compatible with sophisticated manufacturing flows.

FIG. 1c schematically illustrates the semiconductor device 100 in a further advanced manufacturing stage, i.e., during a selective epitaxial growth process 110, during which a silicon/germanium alloy 111 is formed in the cavities 108 with a lateral offset with respect to the gate electrode material 151A that is substantially defined by the width 104W, as previously explained. Consequently, based on a predefined fraction of germanium species incorporated in the material 111, the internal strain level is substantially determined by the lateral offset of the material 111 with respect to material in the channel region 152. However, upon further scaling the overall transistor dimensions, a further increase of the strain transfer efficiency may not be scalable on the basis of the conventional process strategy as described above.

In view of the situation described above, the present disclosure relates to semiconductor devices and processes in which an embedded semiconductor alloy may be positioned in close proximity to the channel region, while avoiding or at least reducing one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which the size of cavities may be increased in a highly controllable manner by increasing the lateral extension thereof so as to extend under the gate electrode material, while at the same time maintaining integrity of the gate electrode structure. In some illustrative aspects disclosed herein, the cavities may be formed so as to extend below a corresponding spacer structure and below a gate electrode material, thereby positioning a strain-inducing semiconductor alloy in direct contact with the semiconductor material of the channel region, which may thus contribute to increased charge carrier mobility. At the same time, a certain amount of the initial semiconductor material may be maintained, at least at the interface formed by the gate dielectric layer and the initially provided semiconductor material, thereby maintaining integrity of the gate electrode structure. Similarly, the spacer structure may be maintained and may thus reliably avoid undue exposure of sensitive portions of the gate electrode structure to any critical process ambient, such as an etch atmosphere, elevated temperatures, as may be applied on preparing the device for the selective epitaxial growth process, and the like. In some aspects disclosed herein, a high degree of controllability in forming the corresponding cavities may be achieved by performing two different etch processes, that is, one etch process on the basis of a plasma assisted anisotropic etch ambient and a subsequent etch process, which may exhibit a crystallographically anisotropic etch behavior, thereby ensuring the integrity of at least a portion of the initial semiconductor material in the vicinity of the gate dielectric material. Consequently, enhanced flexibility in forming corresponding cavities and thus an increased degree of scalability of the strain-inducing mechanism may be accomplished for sophisticated transistor elements.

One illustrative method disclosed herein comprises forming cavities in a crystalline semiconductor region laterally offset to a gate electrode structure of a transistor by performing a first etch process on the basis of a plasma ambient, wherein the cavities have a lateral offset along a length direction with respect to an electrode material of the gate electrode structure. The method further comprises increasing the cavities along the length direction so as to extend below the electrode material by performing a second etch process. Moreover, a strain-inducing semiconductor alloy is formed in the cavities and, finally, drain and source regions are formed in a portion of the strain-inducing semiconductor alloy.

A further illustrative method disclosed herein relates to forming an embedded strain-inducing semiconductor alloy in a transistor. The method comprises forming cavities in an active region of the transistor so as to extend beneath an electrode material of a gate electrode structure that is formed above a portion of the active region. Moreover, the method comprises epitaxially growing the strain-inducing semiconductor alloy in the cavities so as to connect to material of the active region formed beneath the electrode material, wherein the material is separated from the electrode material by a gate insulation layer of the gate electrode structure.

One illustrative field effect transistor disclosed herein comprises a gate electrode structure formed above a crystalline semiconductor region and comprising a gate dielectric layer that separates an electrode material from the crystalline semiconductor region, wherein the gate dielectric layer forms a first interface with a channel portion of the crystalline semiconductor region. The field effect transistor further comprises a strain-inducing semiconductor alloy formed in the crystalline semiconductor region at a drain side and a source side and below the gate dielectric layer, wherein the strain-inducing semiconductor alloy forms a second interface with the channel portion and induces a strain therein. Finally, the field effect transistor comprises drain and source regions formed in the crystalline semiconductor region and a portion of the strain-inducing semiconductor alloy.

BRIEF DESCRIPTION OF THE DRAWINGS

The disclosure may be understood by reference to the following description taken in conjunction with the accompanying drawings, in which like reference numerals identify like elements, and in which.

Figure 1A:
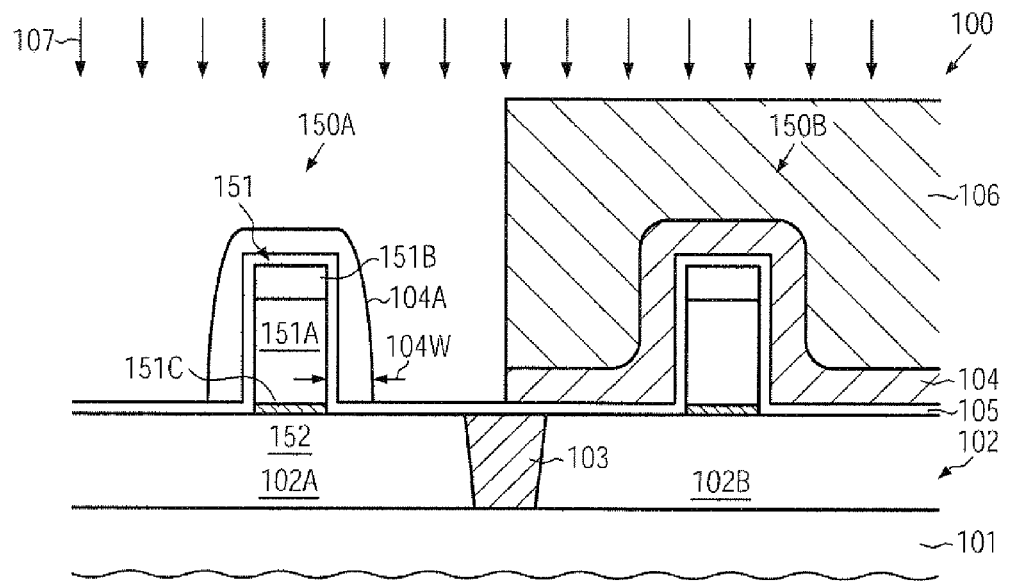
FIGS. 1a-1c schematically illustrate cross-sectional views of a conventional semiconductor device during various manufacturing stages in forming a silicon/germanium alloy in a P-channel transistor, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques for forming the same wherein the strain-inducing mechanism of a semiconductor alloy formed in the active region of a transistor may be increased, while nevertheless providing superior integrity of the gate electrode structures, for instance, by maintaining a desired width of said spacers. To this end, at least the lateral size of cavities may be increased on the basis of a well-controllable etch process so that the cavities may extend under the gate electrode material, while nevertheless not unduly compromising an interface formed between the gate dielectric material and the initial semiconductor material of the active region on which the gate electrode structure is formed. In one illustrative embodiment, the process for forming cavities may be based on a plasma assisted etch process followed by a wet chemical etch process, which may increase the lateral extension along a channel length direction. In some illustrative embodiments, the wet chemical etch process may be performed as a crystallographically anisotropic etch process, thereby obtaining a well-defined shape of the cavities while also maintaining integrity of the interface between a channel portion of the semiconductor material and the gate dielectric layer. For example, a wet etch chemistry may be used that provides a reduced removal rate with respect to the <111> crystallographic orientation or any physically equivalent orientation, such as a <1-11> orientation, a <-111> orientation and the like, so that the substantially rectangular cavities obtained by the preceding anisotropic plasma assisted etch process may be shaped into a "hexagonal" or diamond-shaped cavity with inclined interfaces with the adjacent channel portion of the semiconductor material. Hence, the removal rate during the lateral increase of the cavities is, in these embodiments, determined by the crystallographic configuration and thus results in a well-controllable and highly reproducible final shape and thus size of the cavities. Furthermore, the degree of "under-etching" of a gate electrode material may be selected in accordance with the overall device requirements, wherein even a complete "merging" of the cavities below the gate electrode material may be used in some embodiments, while nevertheless integrity of gate dielectric material may be maintained since a channel portion of the initial semiconductor material may still be maintained. In some illustrative embodiments, the etch process performed to "drive" the cavities below the electrode material may be assisted by providing an appropriate etch stop or etch control material, which may be selectively formed at a bottom face of the initial cavity, thereby ensuring enhanced controllability of the final size of the cavities. Consequently, the effect of the plasma assisted etch process and of the subsequent "lateral" etch process may be decoupled to a certain degree, thereby resulting in enhanced process uniformity and thus less transistor variability while still achieving an enhanced overall strain transfer mechanism.

In still further illustrative embodiments, at least one or more areas may be maintained in the active region in which the under-etching of the gate electrode material may be avoided to provide enhanced mechanical stability of the gate electrode structure upon filling the cavities with the strain-inducing semiconductor alloy. For this purpose, at least in one of the drain and source areas, appropriately positioned and sized stiffening areas may be provided, which may be mechanically coupled to the gate electrode structure and impart superior mechanical stability thereto so that even very pronounced degrees of under-etching of the gate electrode material may be applied without creating a significant lift-off effect of the gate electrode structure during the selective epitaxial growth process. For instance, additional mask material, such as a gate electrode material and the like, may be applied, thereby providing an additional mask during the sequence for etching the cavities. In other cases, a certain degree of etch selectivity with respect to dopant species may be taken advantage of in order to avoid material removal in certain areas, thereby also providing a "split" cavity, at least in one of the drain sides and source sides of the transistor, which may thus act as a reinforcing area for the gate electrode structure during the subsequent epitaxial growth process.

Figure 1B:
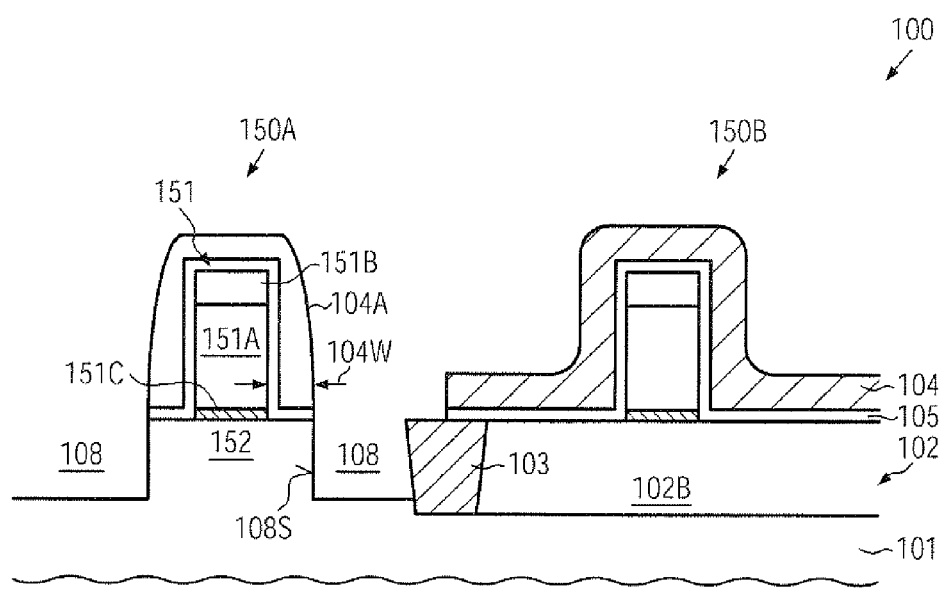
Figure 1C:
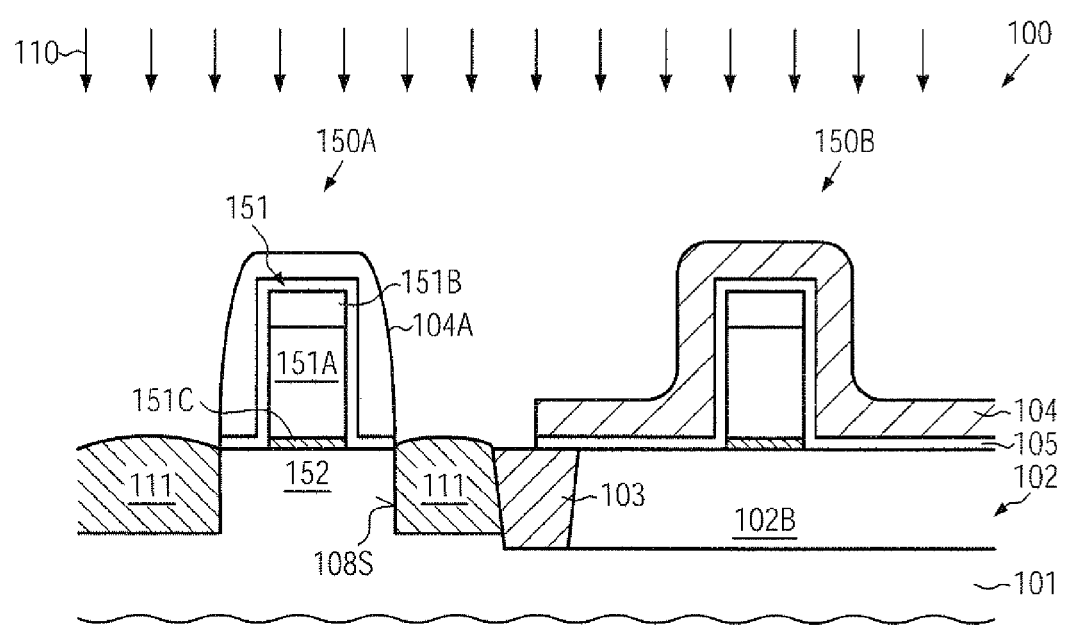

With reference to FIGS. 2a-2j, further illustrative embodiments will now be described in more detail, wherein reference may also be made to FIGS. 1a-1c, if appropriate.

Figure 2A:
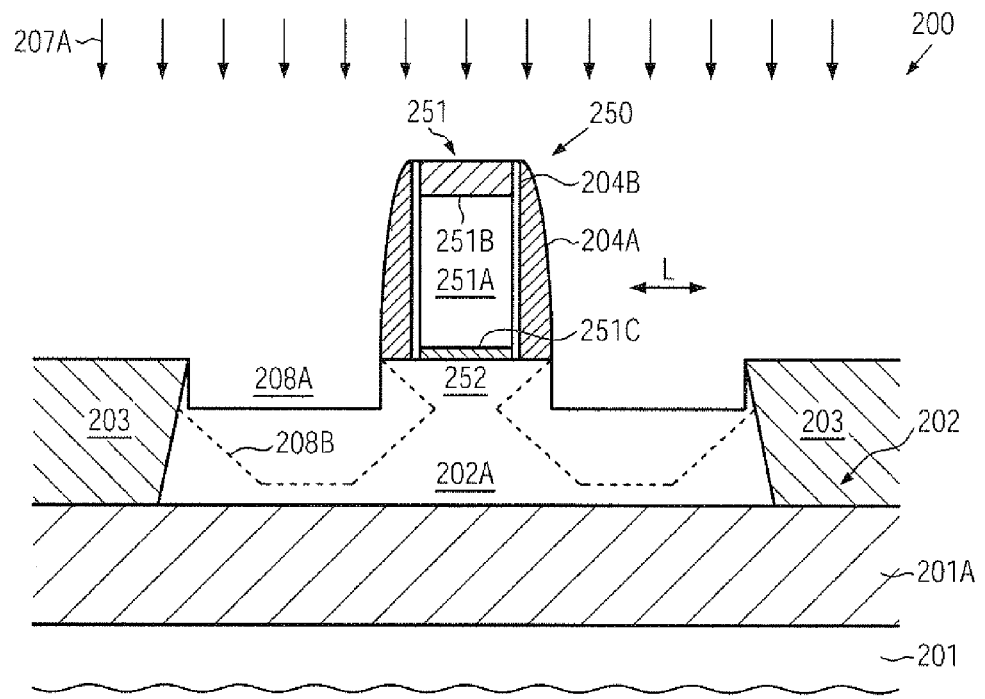
FIGS. 2a-2c schematically illustrate cross-sectional views of the transistor during various manufacturing stages in forming cavities of increased lateral size and filling the same with a strain-inducing semiconductor alloy, according to illustrative embodiments.

FIG. 2a schematically illustrates a cross-sectional view of a semiconductor device 200 comprising a substrate 201, above which may be formed a semiconductor layer 202. Furthermore, as discussed before with reference to the device 100, in some embodiments, a buried insulating layer 201A may be provided between the substrate 201 and the semiconductor layer 202 if an SOI configuration is required, at least in some device regions of the device 200. In other cases, a bulk configuration may be used in which the semiconductor layer 202 may have a thickness that is significantly greater than a vertical extension of drain and source areas of a transistor 250. In other cases, the semiconductor layer 202 may represent an upper portion of a crystalline material of the substrate 201. In the semiconductor layer 202, which may represent a silicon-based material, an active region 202A may be defined by an isolation structure 203, which, in the embodiment shown, may extend down to the buried insulating layer 201A. In the embodiment shown, the active region 202A may be appropriately dimensioned so as to accommodate the transistor 250, while in other cases a plurality of transistor elements may be formed in and above the active region 202A, depending on the overall circuit configuration of the device 200. In the manufacturing stage shown, the transistor 250 may comprise a gate electrode structure 251, which may comprise a gate electrode material 251A, a cap layer 251B and a gate dielectric layer 251C. Furthermore, on sidewalls of the gate electrode structure 251, a spacer structure 204A, possibly in combination with an etch stop liner 204B, may be formed so as to confine, in combination with the cap layer 251B, the electrode material 251A and the gate dielectric layer 251C, as previously discussed. It should be appreciated that, with respect to the components described so far, the same criteria may apply as previously discussed in the context of the device 100. That is, the gate electrode structure 251 may have any appropriate configuration and may have a lateral extension along a length direction, indicated as L, that may be approximately 50 nm and less in sophisticated planar transistor architectures. Similarly, the spacer element 204A in combination with the optional etch stop liner 204B may have any lateral extension along the length direction L as is considered appropriate for the further processing of the device 200, as discussed above. For example, the gate electrode structure 251 may comprise sophisticated materials, such as metal-containing electrode materials formed on the dielectric layer 251C, which may also comprise a high-k dielectric material, if required. In this case, a reliable confinement, in particular of the sensitive high-k dielectric material, may have to be ensured during the further processing of the device until any high temperature processes are no longer required for completing the transistor 250.

The components of the semiconductor device 200 described so far may be formed on the basis of process techniques as previously described in the context of the semiconductor device 100. Thus, after completing the gate electrode structure 251 on the basis of any appropriate manufacturing sequence in forming the spacer structure 204A, possibly in combination with a mask layer, as previously discussed with reference to the transistors 150A, 150B (FIG. 1a), the device 200 is exposed to an etch ambient 207A, which, in some illustrative embodiments, may be established on the basis of a plasma ambient in combination with an appropriate etch chemistry for removing material of the active region 202A, selectively to the spacer 204A, the cap layer 251B and the isolation structure 203, wherein similar process techniques may be used, as previously explained. It should be appreciated that process parameters of the etch process 207A may be appropriately selected so as to take into consideration the effect of a subsequent etch process that may be performed in order to increase the lateral size of cavities 208A that may be obtained on the basis of the etch process 207A. That is, in some illustrative embodiments, a depth of the cavities 208A may be adjusted so as to allow a further increase in depth during the subsequent etch process, while still reliably maintaining a certain degree of "template" material of the active region 202A. For example, as indicated by the dashed lines 208B, which may indicate the effect of a subsequent crystallographically anisotropic etch process, the initial depth of the cavities 208A may be appropriately selected so as to obtain a desired "penetration" of a channel portion 252, while at the same time providing a certain amount of material above the buried insulating layer 201A. Thus, for a given etch rate during the process 207A, a desired depth of the cavities 208A may be readily adjusted on the basis of controlling the etch time, while, in other illustrative embodiments, a certain degree of decoupling of a vertical and lateral etch rate during a subsequent etch process may be accomplished by providing an appropriate etch control layer, as will be described later on in more detail. Consequently, the etch process 207A may be performed on the basis of any well-established anisotropic etch process for removing a crystalline silicon-based semiconductor material selectively to dielectric materials, such as silicon dioxide, silicon nitride and the like.

Figure 2B:
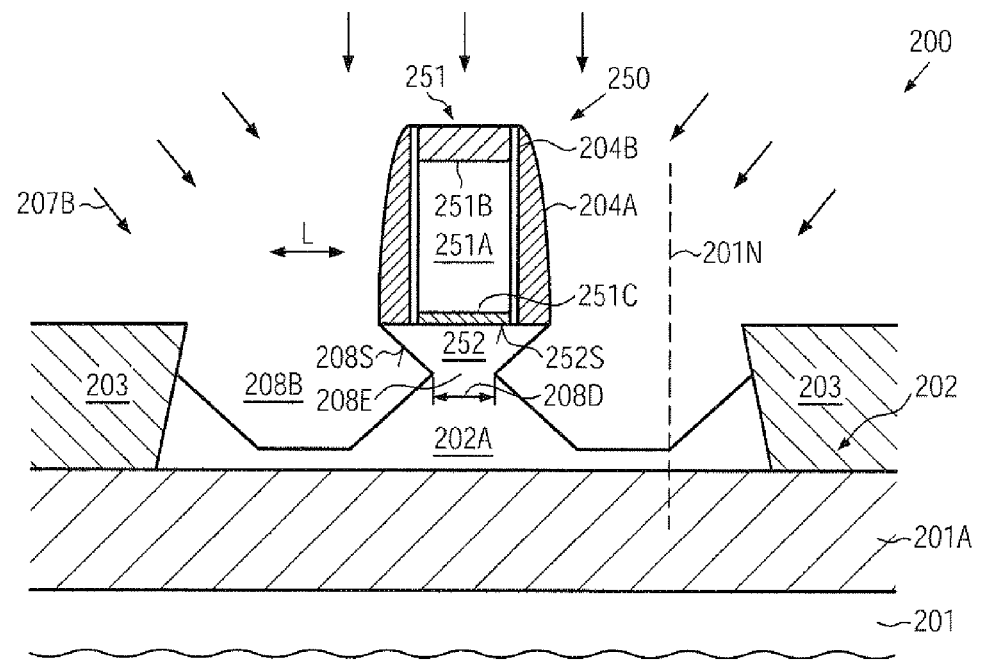

FIG. 2b schematically illustrates the semiconductor device 200 when exposed to a further etch ambient 207B, which may provide a well-controllable lateral increase of the cavities in order to obtain the cavities 208B having a desired overall size, and which may extend beneath the gate electrode material 251A while nevertheless ensuring integrity of an interface 252S formed between the channel portion 252 and the gate dielectric layer 251C. In some embodiments, the etch process 207B may be performed on the basis of a wet chemical etch process that may exhibit a crystallographically anisotropic etch behavior, which is to be understood as describing an etch behavior in which the removal rate in at least one crystallographic orientation is significantly reduced compared to one or more other crystallographic directions. For example, wet etch chemistries based on potassium hydroxide may provide a significantly reduced etch rate along a (111) direction in silicon or any physically equivalent direction, which may thus result in a corresponding inclined surface 208S of the cavities 208B. Corresponding angles of the inclined surfaces 208S with respect to a surface normal 201N is defined by the crystallographic configuration, wherein, in the example shown, the surface normal 201N may correspond to a (100) crystal axis, or a physically equivalent axis, while a channel length direction, i.e., the length direction L, may correspond to a (110) direction or a physically equivalent direction. In this case, the surfaces 208S may substantially correspond to the orientation of (111) planes of the silicon crystal, which may have an angle of approximately 36 degrees with respect to the surface normal 201N. Consequently, the inclined surfaces 208S may have a common "apex" or edge 208E, which may be positioned below the electrode material 251A, wherein the degree of "under-etching," i.e., the lateral position of the apex or edges 208E, may be defined by parameters of the etch process 207B. Hence, the edges 208E below the gate electrode material 251A may have a specified distance 208D, the amount of which may be adjusted by appropriately selecting the parameters of the etch process 207B. In other illustrative embodiments (not shown), the cavities 208B may even merge under the gate electrode material 251A, while nevertheless the inclined advance of the etch front caused by the crystallographically anisotropic etch recipe may still preserve the channel portion 252 and may thus result in a highly strained silicon-based material, while also preserving integrity of the interface 252S.

In one illustrative embodiment, the etch process 207B may be performed on the basis of tetra methyl ammonium hydroxide (TMAH), which is a wet chemical agent that may typically be used for etching photoresist material, which, however, may also be used in higher concentrations and at elevated temperatures of approximately 50-100° C. to etch silicon material. Furthermore, TMAH exhibits a high selectivity with respect to silicon dioxide material and also with respect to silicon nitride so that the cap layer 251B, the spacer 204A and the isolation structure 203 may suffer a negligible material erosion, thereby maintaining integrity of the electrode material 251A and the gate dielectric layer 251C. Furthermore, TMAH may also exhibit a desired crystallographically anisotropic etch behavior, thereby providing a highly controllable lateral advance of the etch front so as to still maintain the channel portion 252. Moreover, in some cases, it may be desirable to "decouple" the vertical etch rate from the lateral etch rate to a certain degree to "drive" the edges 208E further into the channel portion 252, while not significantly further increasing the depth of the cavities 208A (FIG. 2a). In this case, TMAH may be advantageously used in combination with an N-type dopant species incorporated into the active region 202A at a specified depth, since the etch rate of TMAH may be significantly reduced in an N-doped silicon material. Thus, in some illustrative embodiments, a corresponding N-type dopant species, such as arsenic, may be introduced into the active region 202A, for instance prior to forming the cavity 208A (FIG. 2a) or after forming the same in order to provide corresponding etch stop capabilities. In other cases, additional etch control materials may be provided, as will be described later on in more detail.

Figure 2C:
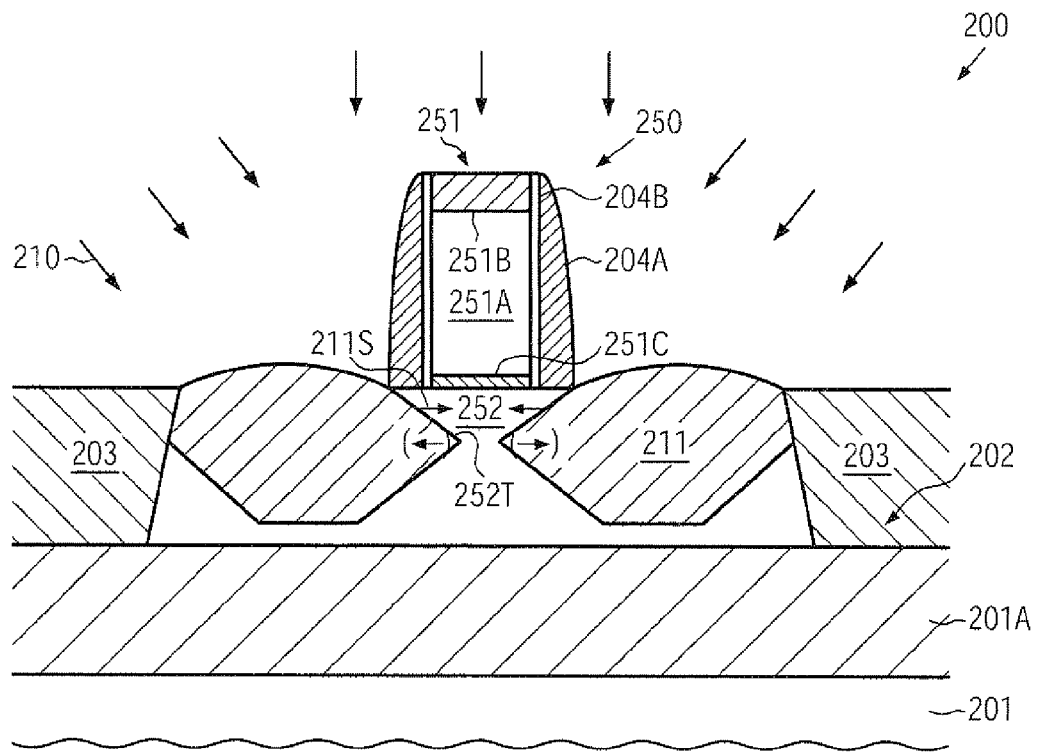

FIG. 2c schematically illustrates the semiconductor device 200 when exposed to a deposition ambient 210 for depositing an appropriate semiconductor alloy, such as silicon/germanium, silicon/germanium/tin, silicon/tin, silicon/carbon and the like. During the selective epitaxial growth process 210, which may be performed on the basis of well-established process techniques, a strain-inducing semiconductor alloy 211 may be formed within the cavities 208B (FIG. 2b), wherein, for a given composition of the semiconductor alloy 211, an increased magnitude of strain 211S may be accomplished within the channel portion 252, since its material may be in direct contact with the strain-inducing semiconductor alloy, thereby forming an interface 252T. Consequently, contrary to conventional strategies, the interfaces 252T may reach laterally beneath the gate electrode material 251A, thereby directly acting on the remaining channel portion 252 and creating an increased degree of strain 211S therein. Due to the crystallographically anisotropic nature of the preceding etch process, resulting in the specific shape of the cavities 208B, the strain-inducing semi-conductor alloy 211 may have respective inclined surface areas, i.e., the interfaces 252T, formed with the channel portion 252. It should be appreciated that, as previously discussed, the cavities 208B may be connected to each other below the gate electrode material 251A.

It should be appreciated that, in other illustrative embodiments, the semiconductor alloy 211 may be provided in the form of a silicon/carbon alloy, which may thus provide a tensile strain component in the channel portion 252, which may be advantageous when the transistor 250 may represent an N-channel transistor. In other illustrative embodiments (not shown), cavities of the type as illustrated by the cavities 208B may also be formed in other transistors and may be filled with an appropriate semiconductor alloy in order to provide an appropriate strain component for different types of transistors. For example, as previously explained with reference to the device 100, N-channel transistors may be masked during the process sequence for forming a compressive strain-inducing semiconductor alloy in P-channel transistors. After a corresponding process sequence, P-channel transistors may be masked and a respective manufacturing sequence may be applied to the N-channel transistors in order to form a tensile strain-inducing semiconductor alloy, such as a silicon/carbon alloy, thereby significantly enhancing performance of these transistors. In other cases, at least a certain sequence of processes may be performed commonly for both types of transistors, for instance forming the corresponding cavities and subsequently appropriately masking one type of transistor while filling the cavities of the other type of transistor.

Figure 2D:
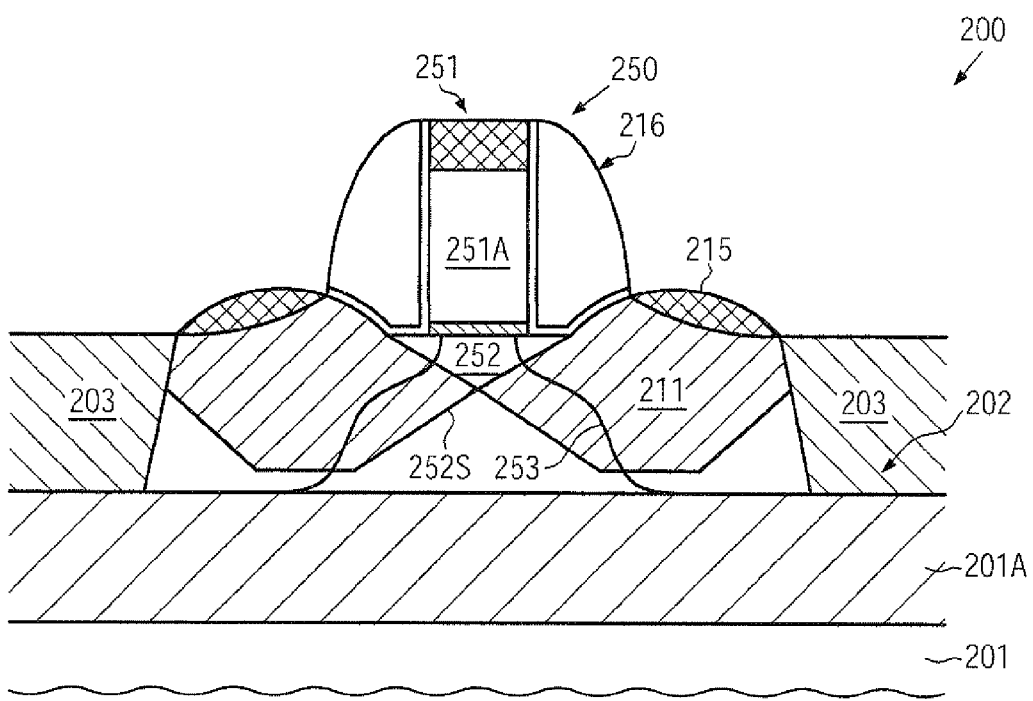
FIGS. 2d-2h schematically illustrate the semiconductor device during various manufacturing stages when forming the cavities with increased lateral size on the basis of an appropriate etch stop or etch control layer, according to further illustrative embodiments.

FIG. 2d schematically illustrates the semiconductor device 200 in a further advanced manufacturing stage. As illustrated, the transistor 250 may comprise drain and source regions 253, which may be partially formed in the strained semiconductor alloy 211. Furthermore, a sidewall spacer structure 216 may be formed on sidewalls of the gate electrode structure 251, wherein the spacer structure 216 may have any appropriate configuration as required for the overall process strategy and the requirements of the transistor 250. Additionally, metal silicide regions 215 may be formed in the drain and source regions 253 and in the gate electrode material 251A, if required.

The semiconductor device 200 as shown in FIG. 2d may be formed on the basis of the following processes. After providing the semiconductor alloy 211, the spacer 204A and the cap layer 251B (FIG. 2c) may be removed and thereafter the spacer structure 216 may be formed, or at least a portion thereof, so as to act as an implantation mask in forming a portion of the drain and source regions 253 on the basis of an ion implantation process. After forming the drain and source regions 253, an appropriate anneal process may be formed in order to activate the dopant species and also re-crystallize implantation-induced damage. Next, the metal silicide regions 215 may be formed by using, for instance, well-established techniques. Subsequently, any further strain-inducing mechanisms may be implemented, for instance, in the form of providing a highly stressed dielectric material above the transistor 250, followed by the deposition of an appropriate interlayer dielectric material. Consequently, the strain-inducing semiconductor alloy 211 may extend deeply into the channel portion 252 and may thus form the interface 252S, thereby obtaining enhanced strain conditions therein, which may provide superior charge carrier mobility and thus transistor performance.

With reference to FIGS. 2e-2l, further illustrative embodiments will now be described in which enhanced controllability of dimensioning the cavities may be achieved by providing an etch stop or etch control material.

Figure 2E:
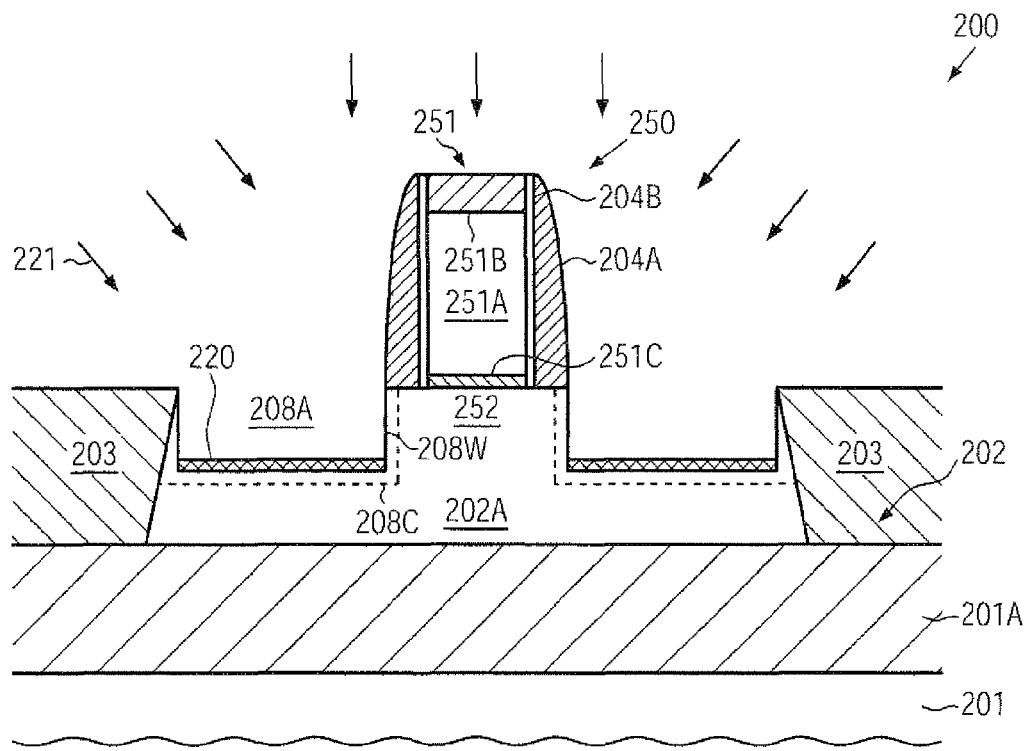

FIG. 2e schematically illustrates the semiconductor device 200 with the cavities 208A formed in the active region 202A on the basis of a plasma assisted anisotropic etch process. Thereafter, in some illustrative embodiments, an etch control layer 220 may be formed, for instance, on the basis of an appropriate treatment 221, for instance in the form of a plasma-based treatment, an ion implantation process and the like. For example, the treatment 221 may result in a significant modification of the etch behavior of horizontal portions of the active region 202A due to a high degree of directionality of the treatment 221. For example, a plasma assisted oxidation may be initiated in order to form the etch control layer 220. In other cases, the treatment 221 may be performed as an ion implantation process in order to incorporate an appropriate species, such as oxygen and the like, thereby also obtaining a significantly different etch behavior during a subsequent etch process. In still other illustrative embodiments, an appropriate dopant species, such as an N-type dopant species, may be incorporated in order to form the layer 220. It should be appreciated that the process 221 in this case may also be performed prior to actually etching the cavities 208A by selecting appropriate implantation parameters. Due to the highly directional nature of the ion implantation process, the sidewalls 208W of the cavities 208A may be affected to a significantly lesser degree compared to the horizontal portions. For example, even if a corresponding modification may result at the sidewalls 208W, a corresponding modified material may be readily removed while still maintaining a significant portion of the etch control layer 220, since this layer may have a significantly greater thickness compared to a corresponding portion formed at the sidewalls 208W. In other illustrative embodiments, an intermediate etch step may be performed prior to the modification process 221, for instance in the form of an isotropic plasma assisted etch process, an isotropic wet chemical etch process and the like, in order to appropriately increase the size of the cavity 208A, as indicated by the dashed line 208C. Consequently, in this case, the sidewalls 208W may be farther driven into the channel portion 252 so that a shadowing effect of the spacers 204A during the process 221 may be pronounced, thereby even further increasing the difference in effect between the horizontal and vertical exposed areas of the cavity 208A, 208C.

Figure 2F:
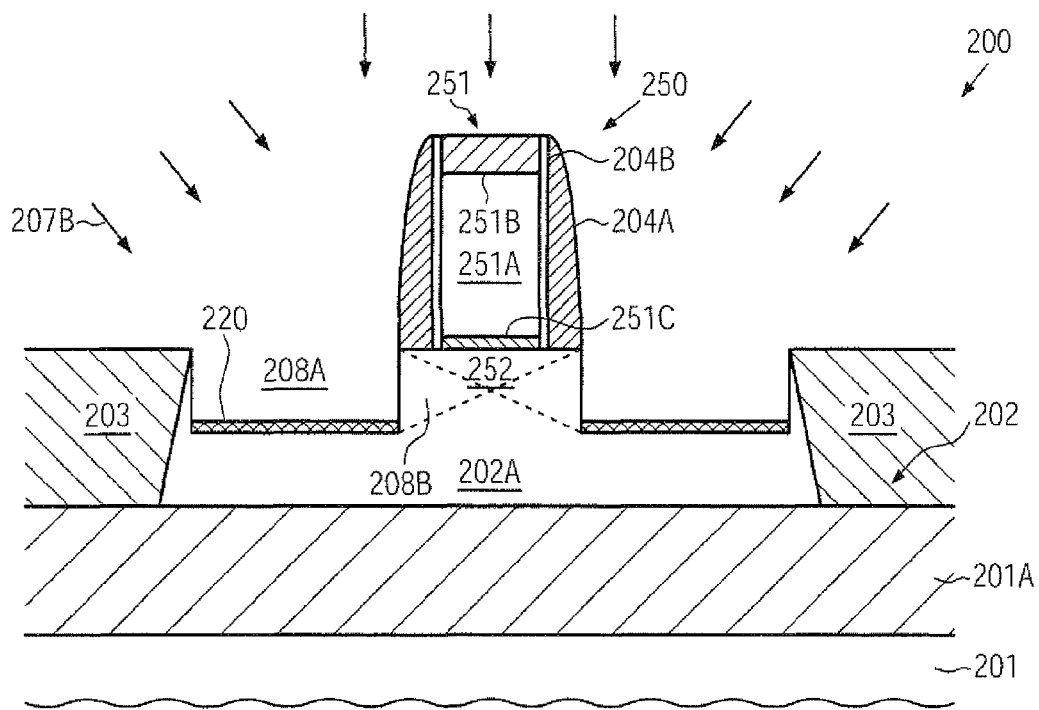

FIG. 2*f* schematically illustrates the semiconductor device 200 when exposed to the etch process 207B for forming the cavities 208B, as indicated by the dashed lines. For example, as previously discussed, a plurality of wet chemical etch recipes may exhibit a high degree of selectivity with respect to materials, such as silicon dioxide, silicon nitride and the like, and hence the etch rate in the vertical direction may be significantly reduced due to the presence of the etch control or etch stop layer 220. For example, as discussed above, TMAH may exhibit an excellent selectivity when etching silicon material selectively to silicon dioxide, silicon nitride and the like. Thus, the advance of the etch front during the process 207B may be substantially restricted to the lateral direction wherein, as previously explained, the crystallographically anisotropic etch behavior may provide the high degree of controllability in order to preserve the channel portion 252. Thus, after forming the cavities 208B, which may also merge in the center of the channel portion 252, as previously explained, the further processing may be continued by removing the etch control layer 220, for instance on the basis of any appropriate etch chemistry, and depositing the strain-inducing semiconductor alloy, as previously explained.

Figure 2G:
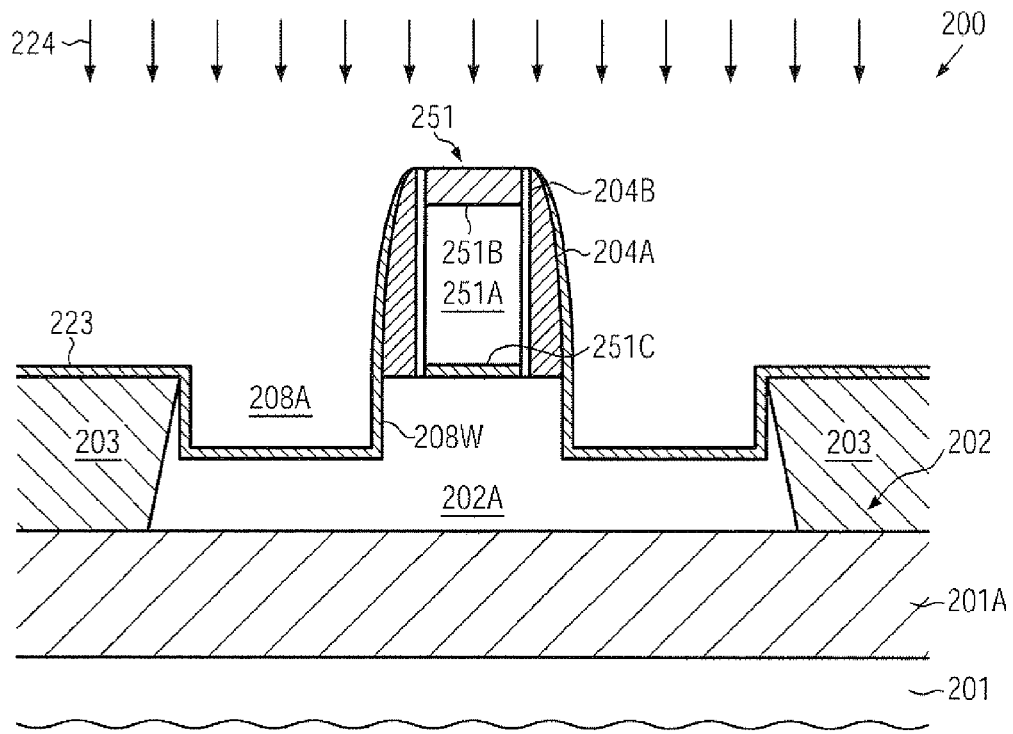

FIG. 2*g* schematically illustrates the semiconductor device 200 according to other illustrative embodiments in which a spacer layer 223 may be formed in a conformal manner to cover exposed surface portions of the cavity 208A. For example, the spacer layer 223 may be formed on the basis of silicon nitride or any other appropriate material. Thereafter, the device 200 may be exposed to an etch ambient 224, i.e., an anisotropic etch recipe, in order to remove the spacer layer 223 and obtain sidewall spacers on vertical surface portions, such as the walls 208W of the cavities 208A.

Figure 2H:
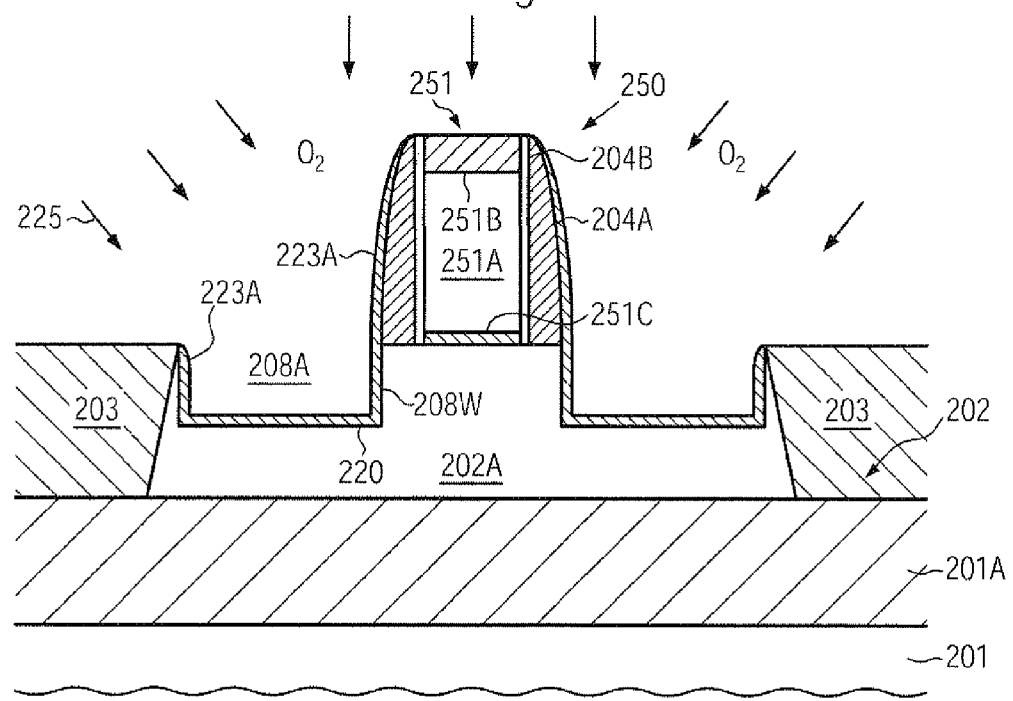

FIG. 2*h* schematically illustrates the semiconductor device 200 with corresponding sidewalls spacers 223A formed on the walls 208W, and also on the spacer 204A due to the preceding anisotropic etch process. Moreover, the device 200 is exposed to a further treatment 225, such as an oxidation process, so as to form the etch control layer 220 on a bottom surface of the cavity 208A, which has been exposed during the preceding etch process 224 (FIG. 2*g*) when forming the spacer elements 223A. The process 225 may be performed on the basis of any appropriate recipe, such as a plasma assisted oxidation process, a wet chemical oxidation process, a thermally activated oxidation process and the like. During the process 225, the spacers 223A may reliably prevent an oxidation of the walls 208W, or may at least significantly reduce a corresponding material modification.

Figure 2I:
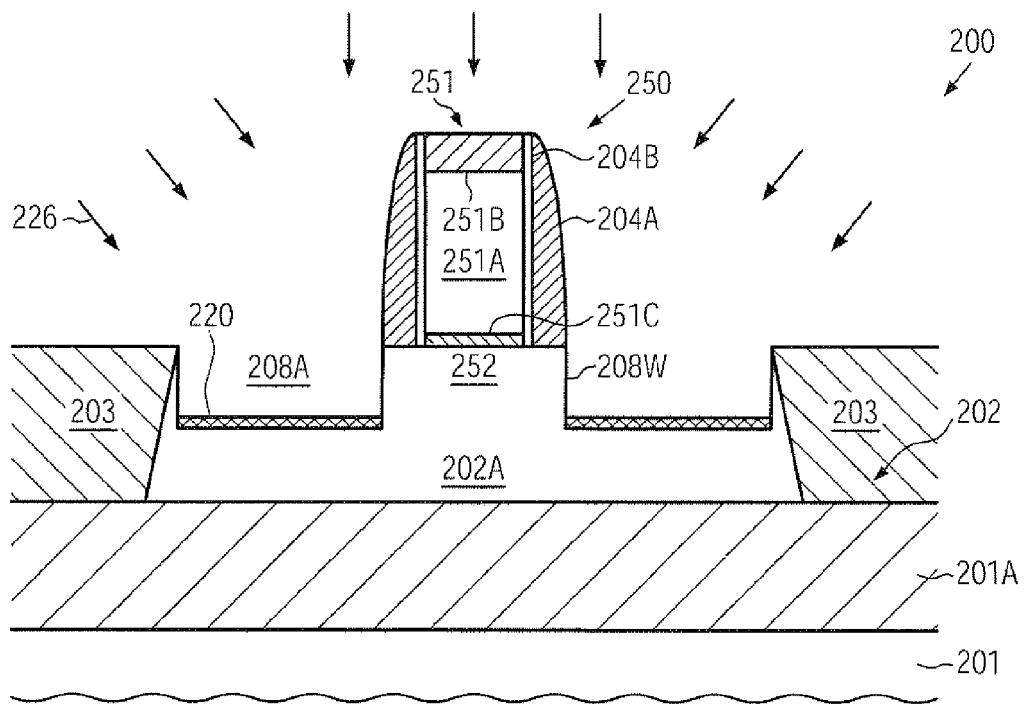
FIGS. 2i-2k schematically illustrate top views of the semiconductor device according to illustrative embodiments in which a stiffening area may be provided to enhance the mechanical integrity of the gate electrode structure formed above the cavities having the increased lateral size.

FIG. 2*i* schematically illustrates the semiconductor device 200 during a further etch process 226, which may be performed on the basis of any appropriate recipe, such as hot phosphoric acid and the like, to remove the spacer element 223A (FIG. 2*h*) selectively to the etch stop or etch control layer 220. It should be appreciated that even the corresponding material erosion of the cap layer 251B and/or of the spacer element 204A may not negatively affect the overall process sequence since a corresponding material erosion, if any, may be taken into consideration when forming these components, since the actual size and degree of under-etching of the channel portion 252 may be defined on the basis of a process sequence, as discussed above. Consequently, after exposing the walls 208W, the lateral size of the cavities 208A may be increased in a highly controllable manner on the basis of a wet chemical etch process, such as the process 207B (FIG. 2*o*, as previously described.

Figure 2J:
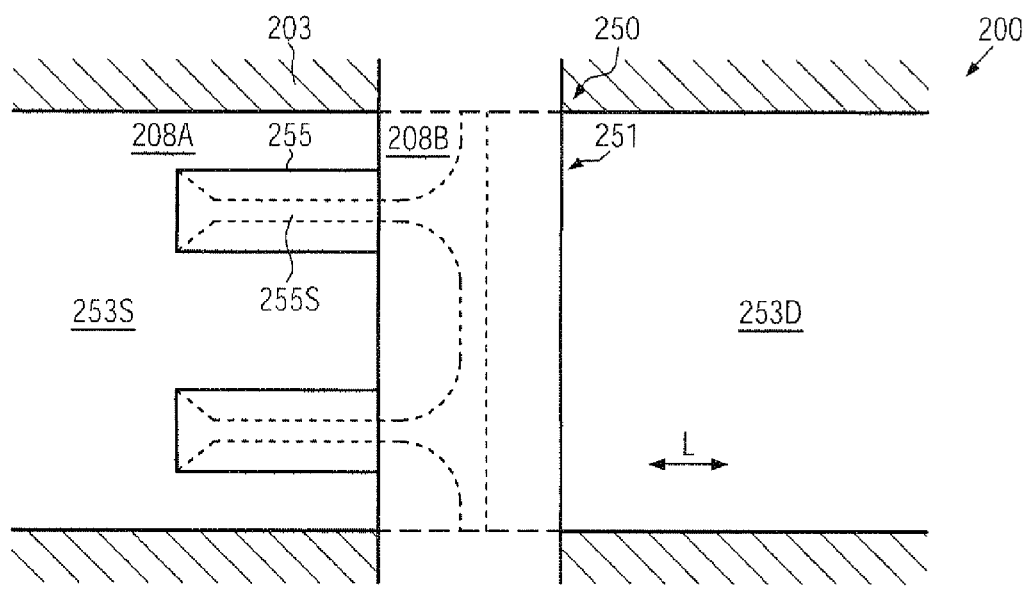
Figure 2K:
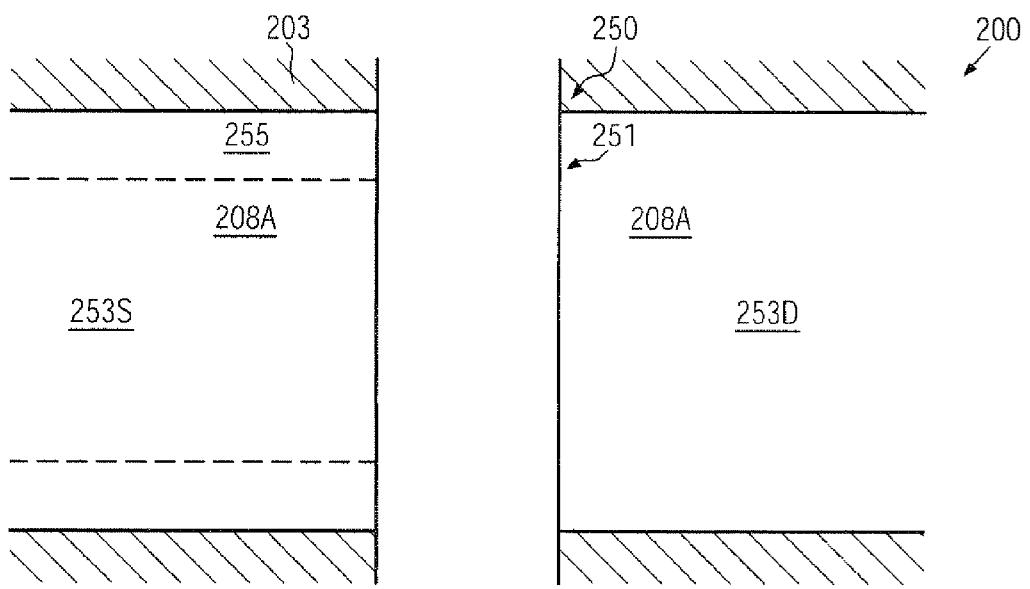

With reference to FIGS. 2*j*-2*k*, further illustrative embodiments will now be described in which the mechanical integrity of the gate electrode structure may be enhanced to maintain a degree of deformation of the gate electrode structure 251 of a low level, for instance the degree of lifting off of the gate electrode structure upon forming the strain-inducing semiconductor alloy in the cavities having the laterally increased size.

FIG. 2*j* schematically illustrates a top view of the semiconductor device 200 in a manufacturing stage in which the cavities 208A are formed laterally adjacent to the gate electrode structure 251 within a source area 253S and a drain area 253D, which represent portions of the active region of the transistor 250. Furthermore, a mask material 255, for instance provided as one or more locally restricted areas in the source area 253S and/or the drain area 253D may be mechanically coupled to the gate electrode structure 251 in order to impart an enhanced degree of "stiffness" to the gate electrode structure 251, even if the structure 251 may be "under-etched" to a very pronounced degree during the formation of the cavities 208B, as previously discussed. For example, the mask material 255 may be provided in the form of an electrode material, such as a polysilicon material and the like, in combination with a respective spacer structure so that the cavity 208A may be provided in different portions, since material of the source area 253S and/or the drain area 253D may be maintained below the mask material 255. Thus, upon performing a chemical etch process for increasing the lateral size of the cavities 208A, thereby obtaining the cavities 208B, a corresponding material 255S may still be maintained below the mask material thereby enhancing the overall stiffness of the structure 251 due to the mechanical coupling of the mask material 255 to the gate electrode structure 251. For this reason, an undue lifting of the gate electrode structure 251 upon filling the cavities 208B with the strain-inducing material may be substantially avoided or at least significantly reduced. It should be appreciated that an extension of the mask material 255 along the length direction L may be selected in accordance with a desired degree of stiffening of the structure 251 and with respect to the overall influence on the characteristics of the transistor 250. For example, by increasing the length direction of the mask material 255, a "split" cavity 208A may be formed, for instance in the source area 253S, thereby also resulting in a corresponding split source area 253S after filling in the strain-inducing semiconductor material and incorporating the dopant species for the drain and source regions. Furthermore, although two mask materials 255 are illustrated in FIG. 2j, any other number of stiffening areas 255S may be employed, depending on the overall device configuration and the like. Furthermore it should be appreciated that, if considered appropriate, one or more of the mask materials 255 may also be formed in the drain area 253D. The mask material 255 may be formed during the manufacturing sequence for forming the gate electrode structure 251 by using an appropriate lithography mask. Consequently, additional process complexity may be avoided while at the same time enhancing the overall mechanical integrity of the gate electrode structure 251.

FIG. 2k schematically illustrates the semiconductor device 200 according to still further illustrative embodiments in which the mask material 255 may be provided in the form of an etch stop or etch control layer, which may be formed in one or both of the source and drain areas 253S, 253D in a locally restricted manner. For example, prior to forming the cavities 208A on the basis of a plasma assisted anisotropic etch recipe, an appropriate material, such as silicon dioxide, silicon nitride and the like, may be deposited or formed by oxidation and may be patterned on the basis of a lithography mask to obtain the mask material 255. Thereafter, the cavities 208A may be formed while using the mask material 255 as an etch stop material, which may also be maintained during the subsequent chemical etch process, thereby ensuring that at least a portion of the semiconductor material covered by the mask material 255 may be maintained and may thus mechanically connect to semiconductor material positioned below the gate electrode structure 251, thereby providing an enhanced degree of mechanical coupling to the gate electrode structure 251. In some illustrative embodiments, the mask material 255 may still be maintained during a portion of the further process sequence, i.e., during a heat treatment for preparing the device 200 for a subsequent epitaxial growth process, thereby reducing the degree of deformation of the cavities 208A. In this case, the mask material 255 may be efficiently removed immediately prior to the selective epitaxial growth process at a process temperature of approximately 750° C. and less and a significant silicon reflow may be avoided, as is also previously explained with reference to the device 100. For this purpose, a chemically reactive ambient may be established within the deposition chamber, for instance on the basis of a chlorine comprising ambient in order to remove silicon dioxide material prior to actually depositing the strain-inducing semiconductor material.

As a result, the present disclosure provides semiconductor devices and techniques in which the lateral size of cavities may be increased in a highly controllable manner so as to position a strain-inducing semiconductor alloy below the gate electrode material while nevertheless maintaining integrity of an interface between the initial semiconductor material and the gate dielectric layer. For this purpose, a cavity formed by a plasma assisted anisotropic etch process may be subjected to a further etch process, such as a crystallographically anisotropic wet chemical etch process, in which the cavity may be "driven" under the gate electrode material and may even result in merged cavities, if desired, while nevertheless preserving the channel portion of the initial semiconductor material. In some aspects, enhanced controllability of the etch process may be accomplished by providing an etch control layer for the second etch process. In still other illustrative embodiments, the degree of deformation of the gate structure may be controlled on the basis of providing a stiffening area that is mechanically coupled to the gate electrode structure so that the degree of lifting off of the gate electrode structure may be reduced during the selective epitaxial growth process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming cavities in a crystalline semiconductor region laterally offset to a gate electrode structure of a transistor by performing a first etch process on the basis of a plasma ambient, said cavities having a lateral offset along a length direction with respect to an electrode material of said gate electrode structure;
increasing said cavities along said length direction so as to extend below said electrode material by performing a second wet chemical etch process having a crystallographically anisotropic etch behavior to define an inclined surface in the cavity starting proximate an edge of said electrode structure and terminating at an apex disposed beneath said gate electrode structure, wherein prior to the forming and increasing of said cavities a mask is formed above said crystalline semiconductor material along only a portion of a width of one side of said gate electrode, and wherein a portion of the crystalline semiconductor material remains below the mask after the forming and increasing of said cavities to define a stiffening area in said crystalline semiconductor region extending outward from said gate electrode and perpendicularly from a width direction of said gate electrode and mechanically coupled to said gate electrode;
forming a strain-inducing semiconductor alloy in said cavities; and
forming drain and source regions in a portion of said strain-inducing semiconductor alloy.

2. The method of claim 1, wherein said stiffening area is formed so as to reduce a degree of material removal of material of said semiconductor region during at least one of said first and second etch processes.

3. The method of claim 2, wherein said mask comprises the same material as said gate electrode.

4. The method of claim 1, wherein forming said stiffening area comprises forming an N-doped region locally within an area corresponding to at least one of said drain region and said source region.

5. The method of claim 1, wherein said second etch process is performed on the basis of tetra methyl ammonium hydroxide (TMAH).

6. The method of claim 1, further comprising forming an etch control layer selectively on a bottom of said cavities prior to performing said second etch process.

7. The method of claim 6, wherein forming said etch control layer comprises modifying a bottom face of said cavities by performing at least one of an ion implantation process and a plasma treatment.

8. The method of claim 7, further comprising performing an intermediate etch process for increasing a size of said cavities prior to performing said at least one of an ion implantation process and said plasma treatment.

9. The method of claim 6, wherein forming said etch control layer comprises forming a sidewall spacer in said cavities, forming said etch control layer by using said sidewall spacer as a mask and removing said sidewall spacer selectively to said etch control layer prior to performing said second etch process.

10. The method of claim 1, wherein said strain-inducing semiconductor alloy comprises at least one of germanium and tin.

11. The method of claim 1, wherein said strain-inducing semiconductor alloy comprises carbon.

12. The method of claim 1, further comprising forming a protection layer on at least one surface of said cavities prior to exposing said semiconductor device to a process temperature of approximately 800° C. and removing said protection layer prior to forming said strain-inducing semiconductor alloy when a process temperature is less than approximately 750° C.

13. A method of forming an embedded strain-inducing semiconductor alloy in a transistor, the method comprising:
    forming cavities in an active region of said transistor using at least one wet chemical etch process that has a crystallographically anisotropic etch behavior, said cavities extending beneath an electrode material of a gate electrode structure formed above a portion of said active region and including an inclined surface starting proximate an edge of said electrode structure and terminating at an apex disposed beneath the gate electrode structure, wherein prior to forming said cavities a mask is formed above said active region along only a portion of a width of one side of said gate electrode, and wherein a portion of the active region remains below the mask after the forming of said cavities to define a stiffening area in said active region in at least one of said drain area or said source area
    extending outward from said gate electrode and perpendicularly from a width direction of said gate electrode that is mechanically coupled to said gate electrode structure, wherein
    said stiffening area subdivides said cavity into split cavities in said at least one of said drain area or said source area; and
    epitaxially growing said strain-inducing semiconductor alloy in said cavities so as to connect to material of said active region formed beneath said electrode material and being separated therefrom by a gate insulation layer of said gate electrode structure.

14. The method of claim 13, wherein forming said cavities comprises performing a first etch process on the basis of a plasma assisted etch chemistry and performing a second etch process on the basis of the wet chemical etch process.

15. The method of claim 14, further comprising forming an etch control layer after performing said first etch process and prior to performing said second etch process.

\* \* \* \* \*